(12) United States Patent
Gao et al.

(10) Patent No.: US 9,647,019 B2
(45) Date of Patent: May 9, 2017

(54) TFT AND MANUFACTURING METHOD THEREOF, ARRAY SUBSTRATE AND MANUFACTURING METHOD THEREOF, X-RAY DETECTOR AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Huichao Gao, Beijing (CN); Zongmin Tian, Beijing (CN); Peng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/429,092

(22) PCT Filed: Jul. 17, 2014

(86) PCT No.: PCT/CN2014/082411
§ 371 (c)(1),
(2) Date: Mar. 18, 2015

(87) PCT Pub. No.: WO2015/035829
PCT Pub. Date: Mar. 19, 2015

(65) Prior Publication Data
US 2015/0270299 A1  Sep. 24, 2015

(30) Foreign Application Priority Data

Sep. 16, 2013  (CN) .......................... 2013 1 0420395

(51) Int. Cl.
*H01L 27/146* (2006.01)
*H01L 27/12* (2006.01)
(Continued)

(52) U.S. Cl.
CPC .... *H01L 27/14612* (2013.01); *H01L 27/1214* (2013.01); *H01L 27/1222* (2013.01);
(Continued)

(58) Field of Classification Search
CPC ... H01L 31/20; H01L 31/0376; H01L 29/786; H01L 27/14612; H01L 27/1214
See application file for complete search history.

(56) References Cited

U.S. PATENT DOCUMENTS

2003/0189175 A1\* 10/2003 Lee et al. ................ 250/370.08
2006/0030084 A1\*  2/2006 Young ................. H01L 27/1214
                                                      438/149
(Continued)

FOREIGN PATENT DOCUMENTS

CN    102544024 A    7/2012
CN    102629577 A    8/2012
(Continued)

OTHER PUBLICATIONS

International Search Report mailed Oct. 22, 2014; PCT/CN2014/082411.
(Continued)

*Primary Examiner* — Marc Armand
(74) *Attorney, Agent, or Firm* — Ladas & Parry LLP

(57) ABSTRACT

A TFT and manufacturing method thereof, an array substrate and manufacturing method thereof, an X-ray detector and a display device are disclosed. The manufacturing method includes: forming a gate-insulating-layer thin film (3'), a semiconductor-layer thin film (4') and a passivation-shielding-layer thin film (5') successively; forming a pattern (5')

(Continued)

that includes a passivation shielding layer through one patterning process, so that a portion, sheltered by the passivation shielding layer, of the semiconductor-layer thin film forms a pattern of an active layer (4a'); and performing an ion doping process to a portion, not sheltered by the passivation shielding layer, of the semiconductor-layer thin film to form a pattern comprising a source electrode (4c') and a drain electrode (4b'). The source electrode (4c') and the drain electrode (4b') are disposed on two sides of the active layer (4a') respectively and in a same layer as the active layer (4a'). The manufacturing method can reduce the number of patterning processes and improve the performance of the thin film transistor in the array substrate.

16 Claims, 7 Drawing Sheets

(51) Int. Cl.
*H01L 29/786* (2006.01)
*H01L 29/45* (2006.01)
*H01L 29/66* (2006.01)

(52) U.S. Cl.
CPC .... *H01L 27/1288* (2013.01); *H01L 27/14614* (2013.01); *H01L 27/14623* (2013.01); *H01L 27/14658* (2013.01); *H01L 29/458* (2013.01); *H01L 29/66765* (2013.01); *H01L 29/78618* (2013.01); *H01L 29/78678* (2013.01)

(56) References Cited

U.S. PATENT DOCUMENTS

| | | | |
|---|---|---|---|
| 2009/0127550 | A1 | 5/2009 | Imai |
| 2010/0237355 | A1* | 9/2010 | Moriguchi ........ H01L 29/66757 257/72 |
| 2011/0175086 | A1* | 7/2011 | Katoh et al. .................... 257/53 |
| 2013/0140573 | A1* | 6/2013 | Nakamura .................... 257/59 |
| 2014/0077160 | A1 | 3/2014 | Dai et al. |

FOREIGN PATENT DOCUMENTS

| | | |
|---|---|---|
| CN | 103474474 A | 12/2013 |
| CN | 103700628 A | 4/2014 |
| CN | 103715094 A | 4/2014 |

OTHER PUBLICATIONS

Written Opinion of The International Searching Authority mailed Oct. 22, 2014; PCT/CN2014/082411.
First Chinese Office Action dated May 7, 2015; Appln. No. 201310420395.6.
Second Chinese Office Action Appln. No. 201310420395.6; Dated Aug. 13, 2015.

\* cited by examiner

TFT AND MANUFACTURING METHOD THEREOF, ARRAY SUBSTRATE AND MANUFACTURING METHOD THEREOF, X-RAY DETECTOR AND DISPLAY DEVICE

TECHNICAL FIELD

Embodiments of the present disclosure relate to a thin film transistor (TFT) and manufacturing method thereof, an array substrate and manufacturing method thereof, an X-ray detector and a display device.

BACKGROUND

X-ray inspection devices are widely used in the fields such as measuring medicine, electronic industry, aerospace industry, etc. In an X-ray inspection device, an inspection function is achieved by such a way that X-rays are converted into visible light, a photodiode receives the light and transforms the photosignal into an electric signal by a photovoltaic effect, and the electric signal is input into a control circuit of the X-ray inspection device with the aid of switching control of a thin film transistor.

For example, a common X-ray detector is an X-ray detector with an amorphous silicon photodiode array as the core, and includes an array substrate; and the array substrate includes a thin film transistor (TFT) and a photodiode. Under the radiation of X-rays, X-ray photos are transformed into visible light by a scintillator layer or a phosphor layer of the detector, next, the visible light is transformed into an electric signal under the action of the photodiode, and the electric signal is read out and output by the thin film transistor. Thus, an image to be displayed is obtained. Storage and readout of the electric signal can be controlled by turning off and turning on the thin film transistor, respectively, so the performance of the thin film transistor is especially important in the device.

Generally speaking, the structure of a thin film transistor mainly includes a substrate, a gate electrode, a source electrode, a drain electrode, a semiconductor layer (an active layer) and a gate insulating layer. Patterns of the gate electrode, the gate insulating layer and the semiconductor layer are successively formed on the substrate, and the source electrode and the drain electrode are formed on the semiconductor layer. In order to avoid poor connection between the source and drain electrodes and the semiconductor layer, caused by inaccurate positioning, such a way of laying the source and drain electrodes to overlap the semiconductor layer is usually adopted.

SUMMARY

Embodiments of the disclosure provide a thin film transistor (TFT) and manufacturing method thereof, an array substrate and manufacturing method thereof, an X-ray detector and a display device, so as to decrease the number of patterning processes.

In a first aspect, at least an embodiment of the disclosure provides a thin film transistor comprising a gate electrode, a source electrode, a drain electrode and an active layer, the source electrode and the drain electrode are disposed on two sides of the active layer respectively, and the source electrode and the drain electrode are disposed in a same layer as the active layer.

In a second aspect, at least an embodiment of the disclosure provides a manufacturing method of a thin film transistor, and the method comprises: forming a gate-insulating-layer thin film, a semiconductor-layer thin film and a passivation-shielding-layer thin film successively; forming a pattern comprising a passivation shielding layer, so that a portion, sheltered by the passivation shielding layer, of the semiconductor-layer thin film forms a pattern of an active layer; and performing an ion doping process to a portion, not sheltered by the passivation shielding layer, of the semiconductor-layer thin film to form a pattern comprising a source electrode and a drain electrode, so that the source electrode and the drain electrode are disposed on two sides of the active layer respectively.

In a third aspect, at least an embodiment of the disclosure provides an array substrate comprising a substrate, a thin film transistor, a passivation layer and a first pixel electrode; in the thin film transistor, a source electrode and a drain electrode are disposed on two sides of an active layer respectively and in a same layer as the active layer, and the first pixel electrode is electrically connected to the drain electrode.

In a fourth aspect, at least an embodiment of the disclosure provides a manufacturing method of an array substrate, and the method comprises: forming a gate-insulating-layer thin film, a semiconductor-layer thin film and a passivation-shielding-layer thin film successively; forming a pattern comprising a passivation shielding layer, so that a portion, sheltered by the passivation shielding layer, of the semiconductor-layer thin film forms a pattern of an active layer; performing an ion doping process to a portion, not sheltered by the passivation shielding layer, of the semiconductor-layer thin film to form a pattern comprising a source electrode and a drain electrode, so that the source electrode and the drain electrode are disposed on two sides of the active layer respectively; forming a passivation-layer thin film to form a pattern comprising a first via hole; and forming a pixel-electrode thin film to form a pattern comprising a first pixel electrode, so that the first pixel electrode is electrically connected to the drain electrode through the first via hole.

In a fifth aspect, at least an embodiment of the disclosure provides an X-ray detector, comprising the thin film transistor or the array substrate as described above.

In a sixth aspect, at least an embodiment of the disclosure provides a display device, comprising the thin film transistor or the array substrate as described above.

BRIEF DESCRIPTION OF THE DRAWINGS

In order to illustrate the technical solution of the embodiments of the disclosure more clearly, the drawings of the embodiments will be briefly described below; it is obvious that the drawings as described below are only related to some embodiments of the disclosure, but not limitative of the disclosure.

DETAILED DESCRIPTION

Figure 1:
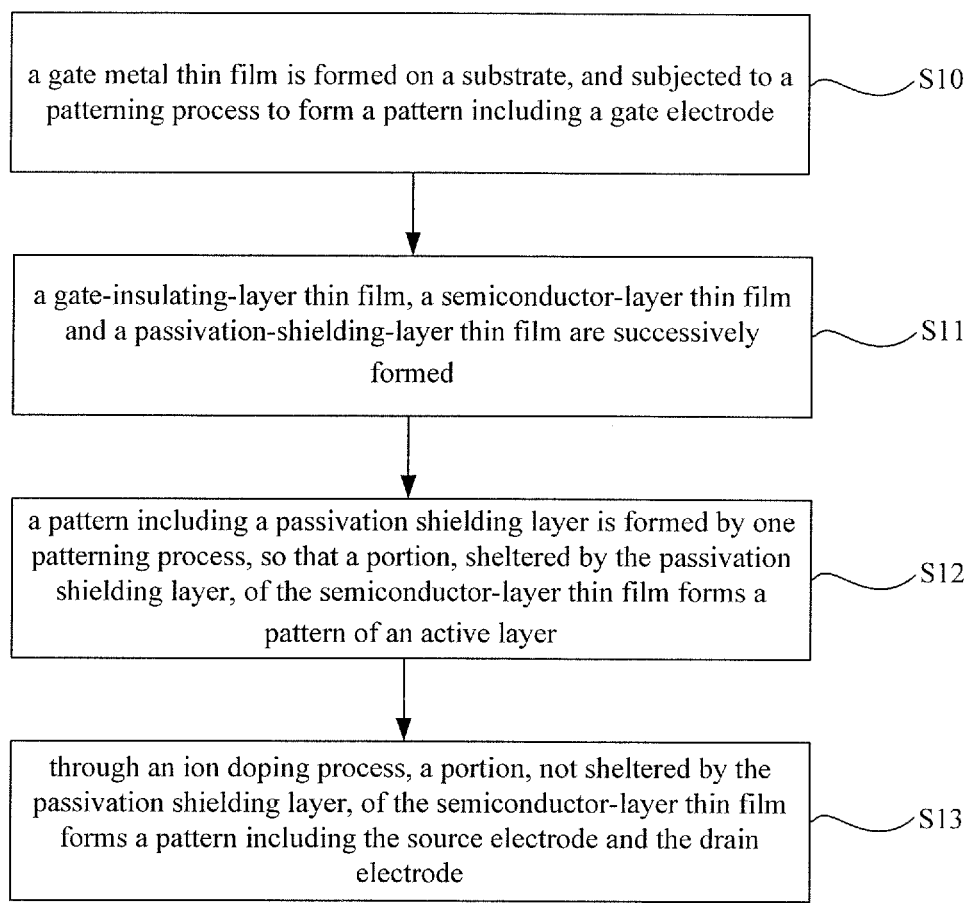
FIG. 1 is a schematic flowchart illustrating a manufacturing method of a thin film transistor provided by Embodiment 2 of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The inventor of the present application noted that, when a thin film transistor in an array substrate adopts the manner of laying source and drain electrodes to overlap an active layer, the manufacture of the source and drain electrodes and the active layer needs to use two patterning processes, and this increases the number of patterning processes. Moreover, face areas between a gate electrode and source and drain electrodes are larger, and this leads to larger coupling capacitances between the gate electrode and the source and drain electrodes. Thus, the performance of the thin film transistor is affected.

In a thin film transistor (TFT) and manufacturing method thereof, an array substrate and manufacturing method thereof, an X-ray detector provided by embodiments of the disclosure, a source electrode, a drain electrode and an active layer are all formed by a same semiconductor-layer thin film, so that the source electrode, the drain electrode and the active layer are disposed in a same layer. Patterns of the source electrode, the drain electrode and the active layer are formed by one patterning process, so the number of patterning processes can be decreased. Moreover, because the source electrode, the drain electrode and the active layer are disposed in the same layer, as compared to the case where the three are disposed in different layers, when the active layer has the same width along a direction of a connecting line between the source electrode and the drain electrode, the face areas between the source and drain electrodes and the gate electrode are decreased, thus the coupling capacitances between the source and drain electrodes and the gate electrode are reduced, and in turn, the performance of the thin film transistor is enhanced.

Embodiment 1

The present embodiment provides a thin film transistor, which includes a gate electrode, a source electrode, a drain electrode, an active layer and a gate insulating layer. The source electrode and the drain electrode are disposed on two sides of the active layer respectively, and the source and drain electrodes are disposed in a same layer as the active layer.

A bottom-gate thin film transistor is given in the embodiment as an example, namely a gate electrode is disposed below an active layer. Of course, the embodiment of the disclosure may also adopt a top-gate structure, namely, a gate electrode is disposed on an active layer, and descriptions for detailed structure are omitted herein. Referring to FIG. 4g, the present embodiment provides a thin film transistor, which includes a gate electrode $2a'$, a source electrode $4c'$, a drain electrode $4b'$, an active layer $4a'$ and a gate insulating layer $3'$. The source electrode $4c'$ and the drain electrode $4b'$ are disposed on two sides of the active layer $4a'$ respectively and in a same layer as the active layer. Patterns of the source electrode, the drain electrode and the active layer are formed by one patterning process (consequently being an integral structure), so the number of patterning processes can be decreased. Moreover, only the gate insulating layer $3'$ exists between the source and drain electrodes $4c'$ and $4b'$ and the gate electrode $2a'$, which are provided without a semiconductor layer as an active layer. Compared with the structure that both a gate insulating layer and a semiconductor layer are disposed between source/drain electrodes and a gate electrode, dielectric constants between the source and drain electrodes $4c'$ and $4c$ and the gate electrode $2a'$ can be decreased by embodiments of the disclosure. Therefore, the coupling capacitances between the source and drain electrodes and the gate electrode are reduced, and the performance of the thin film transistor is enhanced.

In addition, along a direction of a connecting line between the source electrode and the drain electrode, when an active layer is provided with the same width (i.e., a left-to-right distance as shown in the figure), the case that the source and drain electrodes $4c'$ and $4b'$ are disposed in a same layer as the active layer $4a'$, compared with the case that the source and drain electrodes $4c'$ and $4b'$ and the active layer $4a'$ are disposed on different layers, can reduce the face areas between the source and drain electrodes $4c'$ and $4b'$ and the gate electrode $2a'$. As such, the coupling capacitances between the source and drain electrodes and the gate electrode can also be reduced, and in turn, the performance of the thin film transistor can be enhanced.

In order that performance of the thin film transistor can be further enhanced, for example, in at least one example of the disclosure, along a direction of a connecting line between the source electrode and the drain electrode, the width of the active layer $4a'$ can be identical to the width of the gate electrode $2a'$. This can enable the source and drain electrodes $4c'$ and $4b'$ and the gate electrode $2a'$ to have no face area between them, and thus can further decrease the coupling capacitances between the source and drain electrodes and the gate electrode.

It is to be noted that, in the embodiment of the disclosure, because there is no semiconductor layer between the source and drain electrodes and the gate electrode, the distances between them are decreased. In general, variation in distance can also cause the capacitance between two electrodes to change. But, in the embodiment of the disclosure, the thickness of the thin film used for forming the semiconductor layer is very small, variations in distances between the source and drain electrodes and the gate electrode are very tiny as well. Thus, an effect on the coupling capacitors between the source and drain electrodes and the gate electrode is very small or negligible.

Embodiment 2

The present embodiment provides a manufacturing method of the thin film transistor as described in embodiment 1, and the method includes: forming a semiconductor-layer thin film and a passivation-shielding-layer thin film successively; forming a pattern including a passivation shielding layer by one patterning process, so that a portion, sheltered by the passivation shielding layer, of the semiconductor-layer thin film forms a pattern of an active layer; and then, by using an ion doping process, for example, bring a portion, not sheltered by the passivation shielding layer, of the semiconductor-layer thin film to form a pattern including a source electrode and a drain electrode.

A bottom-gate structure is given in the embodiment as an example, namely a gate electrode is disposed below an active layer. Of course, the embodiment of the disclosure may also adopt a top-gate structure, namely, a gate electrode is disposed on an active layer, and descriptions for detailed structure are omitted herein. As illustrated in FIG. 1, based on a thin film transistor provided by Embodiment 1, the embodiment provides a method for manufacturing the thin film transistor structure, and the method includes the following steps.

Figure 4A:
FIG. 4a to FIG. 4i are schematic views illustrating structures of an array substrate during manufacture processes, provided by Embodiment 4 of the disclosure.

S10, referring to FIG. 4a, a gate metal thin film is formed on a substrate 1', and subjected to a patterning process to form a pattern including a gate electrode 2a'.

There are usually many ways such as deposition, coating, sputtering, etc. to form a thin film, and a patterning process generally includes photoresist coating, exposure, development, etching, photoresist stripping processes, and so on.

Firstly, a layer of gate metal thin film can be deposited on a substrate by way of sputtering or thermal evaporation, and the substrate can be a transparent glass substrate, and can also be a quartz substrate. The gate metal thin film can adopt Cr, W, Ti, Ta, Mo, Al, Cu or other metal and an alloy thereof. Of course, the gate metal thin film can also be formed of a multilayered metal thin film. No limitations are imposed thereto.

Secondly, a photoresist is coated on the gate metal thin film, and is exposed with a common mask, so as to form a complete-exposure region and a complete-unexposure region on the substrate F. The photoresist within the complete-exposure region is removed through a development process, so that the gate metal thin film within the complete-exposure region is exposed, and the photoresist within the complete-unexposure region is retained.

Then, the exposed gate metal thin film within the complete-exposure region is removed through an etching process, next, the photoresist within the complete-unexposure region is removed through a stripping process, and the exposed gate metal thin film forms a pattern including a gate electrode 2a' and gate lines (not shown in the figure) as illustrated in FIG. 4a. Herein, for example, a gate line and the gate electrode are integrally formed.

S11, a gate-insulating-layer thin film, a semiconductor-layer thin film and a passivation-shielding-layer thin film are successively formed.

Firstly, a gate-insulating-layer thin film and an amorphous silicon thin film are deposited on the substrate 1' with the gate electrode 2a' formed thereon. The gate-insulating-layer thin film can adopt an oxide, a nitride or an oxynitride, for example, silicon dioxide or silicon nitride; and the amorphous silicon thin film can adopt, for example, an amorphous silicon (a-si).

Next, the amorphous silicon thin film is irradiated with laser through a laser radiation process, so that the amorphous silicon thin film is converted into a polycrystalline silicon thin film, and the polycrystalline silicon thin film forms the semiconductor-layer thin film required by this step. It can be seen from the above contents that, unlike a semiconductor-layer thin film usually formed by an amorphous silicon thin film and a doped amorphous silicon (e.g. n+a-si) thin film, the semiconductor-layer thin film here is a polycrystalline silicon thin film formed by irradiating a deposited amorphous silicon thin film through laser radiation. As such, it is possible to make preparation for forming an active layer 4a', and conducting an ion doping process to the polycrystalline silicon thin film.

In terms of the above laser radiation process, a high-temperature oxidation process using laser annealing can be used, so that the amorphous silicon is converted into high-temperature polycrystalline silicon. But the temperature during this treating process can usually exceed 1000° C., and a glass substrate can usually be softened and molten under high temperature. Thus, in order to ensure that the substrate can withstand such a high temperature, a quartz substrate is chosen as the substrate in this case. Or, a low-temperature radiation process can be employed, which adopts excimer laser as a heat source. After laser goes through a transmission system, a laser beam with evenly-distributed energy can be generated and radiate onto the formed amorphous silicon thin film, so that amorphous silicon is converted into low-temperature polycrystalline silicon. Compared to the former, the whole treating process can be accomplished at 200-400° C., and therefore, not only a quartz substrate can bear the temperature, but also a common glass substrate also can bear the temperature. In addition, low-temperature polycrystalline silicon has the advantages of fast electron migration rate, smaller thin film circuit area, high resolution as well as simple structure, stable performance and so on. Therefore, in an example, the latter (low-temperature radiation process) is employed in the embodiment of the disclosure.

After that, a passivation-shielding-layer thin film is deposited on the substrate with the polycrystalline silicon thin film (the semiconductor-layer thin film) deposited thereon. An oxide, a nitride or an oxynitride, such as silicon dioxide or silicon nitride, can be used for the passivation-shielding-layer thin film.

S12, a pattern including a passivation shielding layer 5' is formed by one patterning process, so that a portion, sheltered by the passivation shielding layer 5', of the semiconductor-layer thin film forms a pattern of an active layer 4a'.

Figure 4B:
Figure 4C:
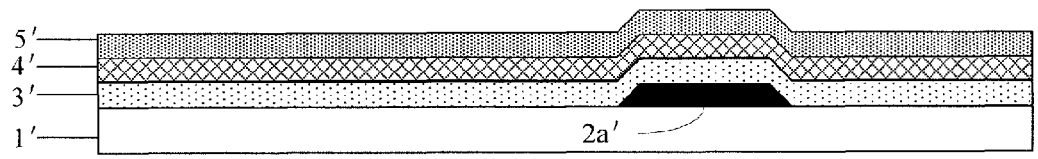
Figure 4D:
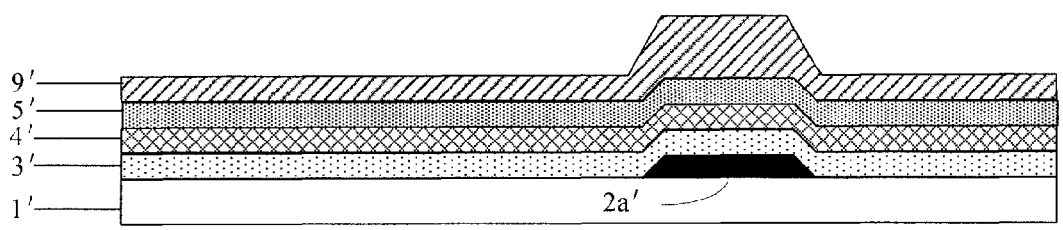
Figure 4E:
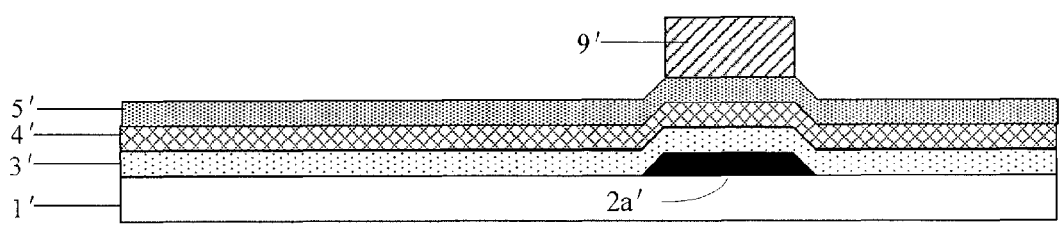
Figure 4F:
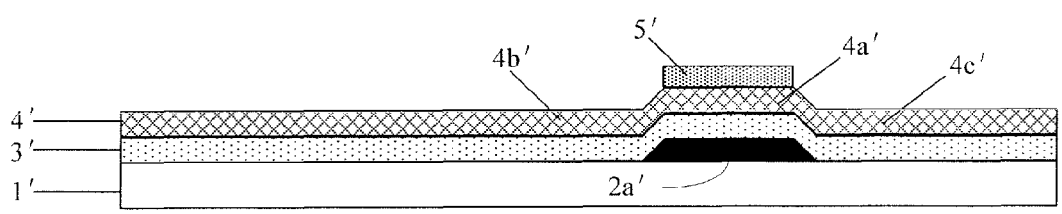
Figure 4G:
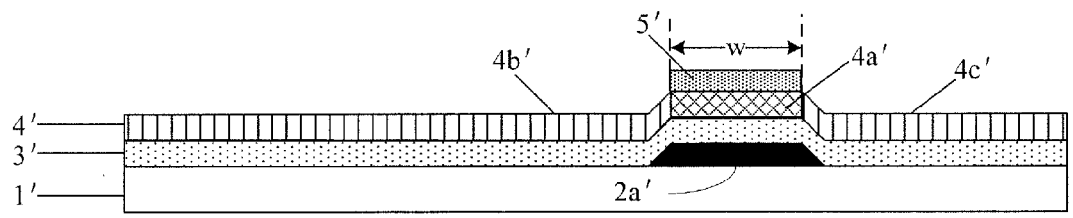

Referring to FIG. 4b and FIG. 4f as well as FIG. 4f and FIG. 4g, a pattern including an active layer 4' and a passivation shielding layer 5' can be formed by one patterning process, so that a portion, sheltered by the passivation shielding layer 5', of the semiconductor layer 4' forms the pattern of the active layer 4a', and other portion, not sheltered, of the semiconductor layer 4' has the same pattern as the source electrode 4c', the drain electrode 4b' and the data line. The formation manner of the pattern of the passivation shielding layer 5' and the semiconductor layer 4' (including patterns of the active layer 4a', the source electrode 4c', the drain electrode 4b' and the data line) will be described in detail below.

At first, as illustrated in FIG. 4b, a photoresist 9' is coated on the passivation shielding layer 5', and is exposed by using, for example a double-tone mask, so that a region on the substrate 1' corresponding to the active layer 4a' is a complete-unexposure region, a region corresponding to pattern of the source electrode 4c' and the drain electrode 4b' is a partial-exposure region, and the other region is a complete-exposure region. Then, through a development process, the photoresist in the complete-exposure region is removed, and the photoresist in the complete-unexposure region is retained and the thickness of the photoresist in the partial-exposure region is thinned.

Next, the passivation-shielding-layer thin film and the semiconductor-layer thin film in the complete-exposure region are removed through an etching process, and the passivation-shielding-layer thin film, the semiconductor-layer thin film and the gate-insulating-layer thin film in the partial-exposure region and the complete-unexposure region are retained (not etched). In turn, the pattern of the semiconductor layer 4' and the gate insulating layer 3' can be formed. And the pattern of the formed semiconductor layer is the same as a data-layer pattern comprising the active layer 4a', the source electrode 4c', the drain electrode 4b' and the data line.

Next, the photoresist 9' in the partial-exposure region is removed through an ashing process, so as to expose the passivation-shielding-layer thin film within the region, and a structure shown in FIG. 4e is formed.

Then, the exposed passivation-shielding-layer thin film in the partial-exposure region is removed through an etching process, and the semiconductor layer in this region is retained and exposed. The exposed semiconductor layer has the same pattern as the pattern comprising the source electrode 4c', the drain electrode 4b' and the data line. As such, prefabrication of the pattern of the source electrode 4c', the drain electrode 4b' and the data line is realized, so that the exposed semiconductor layer is formed into a conductor after subjected to the following ion doping process.

After that, the photoresist 9' in the complete-unexposure region is stripped off, and the exposed passivation-shielding-layer thin film forms the passivation shielding layer 5'. The semiconductor layer that is retained and not exposed in this region has a same pattern as the pattern of the active layer, and a structure shown in FIG. 4f is formed.

In addition, it can be understood that, by opposing the above passivation shielding layer 5' to the gate electrode 2a', a portion, sheltered by the passivation shielding layer, of the semiconductor-layer thin film forms the active layer 4a'. The width of the active layer 4a' can be the same as the width of the gate electrode 2a' (for example, a width w shown in FIG. 4g). This enables the source and drain electrodes 4c' and 4b' and the gate electrode 2a' to have no face area between them, in turn, can further reduce the coupling capacitances between the source and drain electrodes and the gate electrode, and improve the performance of the thin film transistor.

S13, through an ion doping process, a portion, not sheltered by the passivation shielding layer, of the semiconductor-layer thin film forms a pattern including the source electrode 4c, the drain electrode 4b' and the data line (not shown in the figure).

The ion doping process used in the step S13 can be chemical deposition process doping, diffusion doping or ion implantation doping. For example, the ion implantation doping is adopted in the present embodiment of the disclosure. For example, ion implantation is conducted to a portion, not sheltered by the passivation shielding layer 5', of the polycrystalline silicon layer (the semiconductor layer) through an ion implantation equipment. In general, the higher the concentration of injected ions is, the better the performance of conductors formed by the source electrode 4c', the drain electrode 4b' and the data line is, and the better the ohmic contact with the active layer 4a' is. But, it needs to be noted that, the concentration of injected ions is not the higher the better, and also needs to be set according to an actual manufacturing method, usage and other situations of a thin film transistor. No limitations are imposed thereto.

It can be known from the above steps that, the source electrode 4c', the drain electrode 4b' and the active layer 4a' are all formed by a same semiconductor-layer thin film, so that the source electrode 4c', the drain electrode 4b' and the active layer 4a' are disposed in a same layer. As such, only the gate insulating layer 3' exists between the source and drain electrodes 4c' and 4b' and the gate electrode 2a', without a semiconductor layer existing between them. Compared with the structure that both a gate insulating layer and a semiconductor layer are disposed between source and drain electrodes and a gate electrode, dielectric constants between the source and drain electrodes and the gate electrode can be decreased by the embodiment of the disclosure.

Therefore, the coupling capacitances between the source and drain electrodes and the gate electrode are reduced, and the performance of the thin film transistor is enhanced.

It is to be noted that, with the above steps, the manufacture of the pattern comprising a gate insulating layer, an active layer, a source electrode, a drain electrode, a data line and a passivation shielding layer can be realized by one patterning process, and this helps to reduce the number of patterning processes in the manufacturing process. Furthermore, with the manufacturing method of the thin film transistor provided by embodiment of the disclosure, the number of patterning processes can be reduced, and the performance of the manufactured thin film transistor can be enhanced as well.

In addition, the thin film transistor provided by the embodiment of the disclosure can be applied to an array substrate in a display, and can also be applied to an array substrate in an X-ray detector (or, it can be referred to as a detecting substrate), for example. Accordingly, the manufacturing method of the thin film transistor provided by the embodiment of the disclosure not only is suitable for the manufacturing process of an array substrate in a display, but also can be applied to the manufacturing process of an array substrate in an X-ray detector, for example. Descriptions will be made below by taking the structures and manufacturing methods of array substrates of these two kinds as examples, respectively.

Embodiment 3

The present embodiment provides an array substrate, which includes a substrate, a thin film transistor, a passivation layer, and a first pixel electrode. In the thin film transistor, a source electrode and a drain electrode are disposed on two sides of an active layer respectively and in a same layer as the active layer. And the first pixel electrode is electrically connected to the drain electrode.

A bottom-gate thin film transistor is given in the embodiment as an example, namely, a gate electrode is disposed below an active layer. Of course, the embodiment of the disclosure can also adopt a top-gate structure, namely, a gate electrode is disposed on an active layer, descriptions for detailed structure is omitted herein. As illustrated in FIG. 4i, the present embodiment provides an array substrate, which includes a substrate 1', a gate electrode 2a', a source electrode 4c', a drain electrode 4b', an active layer 4a' and a gate insulating layer 3', a passivation layer 6', a first pixel electrode 7'. The source electrode 4c' and the drain electrode 4b' are disposed on two sides of the active layer 4a' respectively and in a same layer as the active layer 4a', and the source electrode 4c' is electrically connected to the first pixel electrode 7'.

The pattern of the source electrode 4c', the drain electrode 4b' and the active layer 4a' is formed by one patterning process, so that the number of patterning processes is decreased, and the manufacturing cost is reduced.

Because the source electrode 4c', the drain electrode 4b' and the active layer 4a' are provided in a same layer, only the gate insulating layer 3' exists between the source and drain electrodes 4c' and 4b' and the gate electrode 4a', without a semiconductor layer existing between them. As compared with the structure that both a gate insulating layer and a semiconductor layer are disposed between source and drain electrodes and a gate electrode, dielectric constants between the source and drain electrodes and the gate electrode can be decreased by the embodiment of the disclosure. Therefore, the coupling capacitances between the source and drain electrodes and the gate electrode are reduced, and the performance of the thin film transistor is enhanced.

It is to be noted additionally that, along a direction of a connecting line between the source electrode and the drain electrode, in the case of an active layer provided with the same width (i.e., a left-to-right distance as shown in the figure), the case that the source and drain electrodes and the active layer are disposed in a same layer, compared with the case that the source and drain electrodes are disposed in a different layer from the active layer, face areas between the source and drain electrodes and the gate electrode are decreased. As such, coupling capacitances between the source and drain electrodes and the gate electrode can also be reduced, and in turn, the performance of the thin film transistor is enhanced.

In order that performance of the thin film transistor can be further enhanced, for example, along a direction of a connecting line between the source electrode and the drain electrode, the width of the active layer 4a' can be the same as the width of the gate electrode 2a'. This enables the source and drain electrodes and the gate electrode to have no face area between them, and in turn, coupling capacitances between the source and drain electrodes and the gate electrode can further be reduced.

Embodiment 4

The present embodiment provides a manufacturing method of an array substrate (e.g. that described in Embodiment 3), and the method includes the following steps.

A semiconductor-layer thin film and a passivation-shielding-layer thin film are successively formed; a pattern including a passivation shielding layer is formed by one patterning process, so that a portion, sheltered by the passivation shielding layer, of the semiconductor-layer thin film forms a pattern of an active layer; a portion, not sheltered by the passivation shielding layer, of the semiconductor-layer thin film is formed into a pattern including a source electrode and a drain electrode through an ion implantation process, with the source electrode and the drain electrode disposed on two sides of the active layer respectively; a passivation-layer thin film is formed, and subjected to a patterning process to form a pattern including a first via hole; and a pixel-electrode thin film is formed, and subjected to a patterning process to form a pattern including a first pixel electrode, so that the first pixel electrode is electrically connected to the drain electrode through the first via hole.

Figure 2:
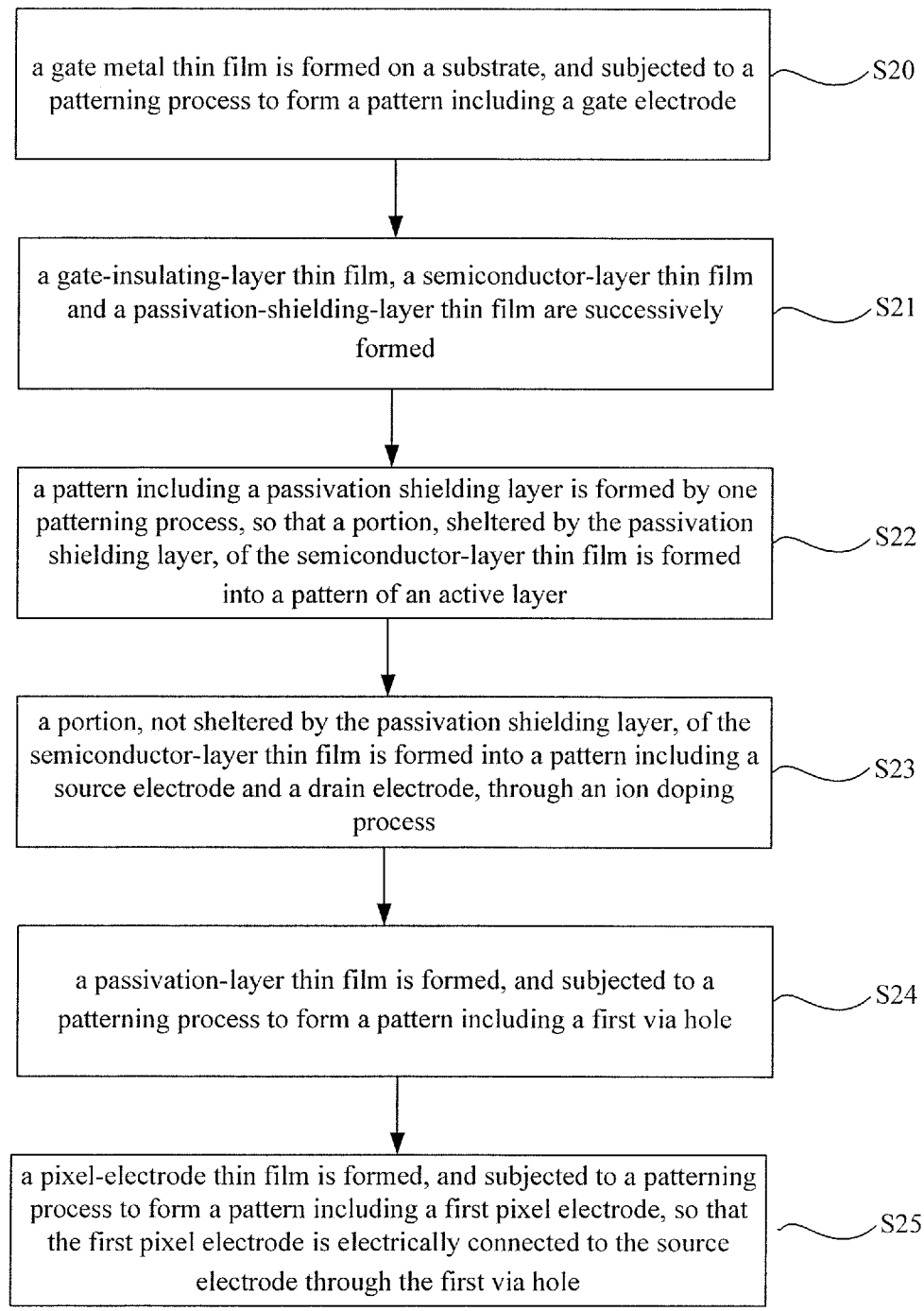
FIG. 2 is a schematic flowchart illustrating a manufacturing method of an array substrate provided by Embodiment 4 of the disclosure.

A bottom-gate structure is given in the embodiment as an example, namely a gate electrode is disposed below an active layer. Of course, the embodiment of the disclosure can also adopt a top-gate structure, namely, a gate electrode is disposed on an active layer, and descriptions for detailed structure are omitted herein. As illustrated in FIG. 2, based on the array substrate provided by Embodiment 3, a method for manufacturing the array substrate is provided by the embodiment. The method includes the following steps.

S20, a gate metal thin film is formed on a substrate 1', and subjected to a patterning process to form a pattern including a gate electrode 2a'.

S21, a gate-insulating-layer thin film, a semiconductor-layer thin film and a passivation-shielding-layer thin film are successively formed.

S22, a pattern including a passivation shielding layer 5' is formed by one patterning process, so that a portion, sheltered by the passivation shielding layer 5', of the semiconductor-layer thin film is formed into a pattern of an active layer 4a'.

S23, a portion, not sheltered by the passivation shielding layer 5', of the semiconductor-layer thin film is formed into a pattern including a source electrode 4c' and a drain electrode 4b', through an ion doping process.

Figure 5A:
FIG. 5a to FIG. 5i are schematic views illustrating structures of an array substrate during manufacture processes, provided by Embodiment 6 of the disclosure.
Figure 5B:
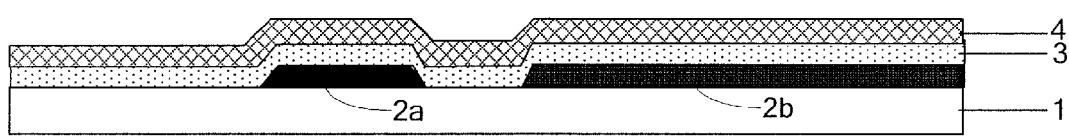
Figure 5C:
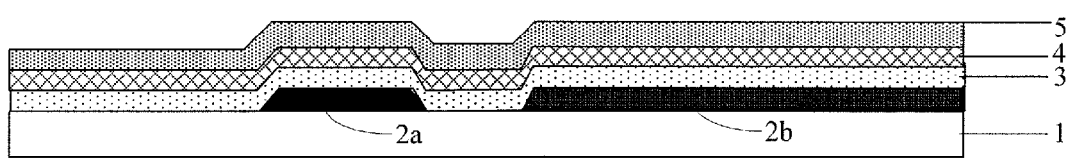
Figure 5D:
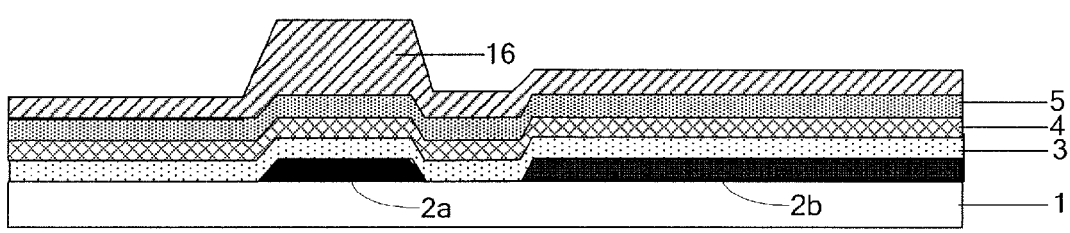
Figure 5E:
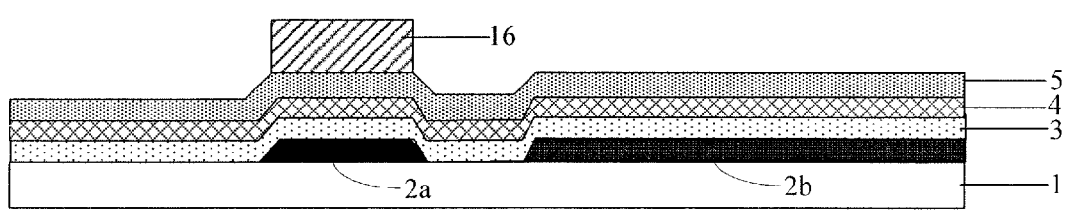
Figure 5F:
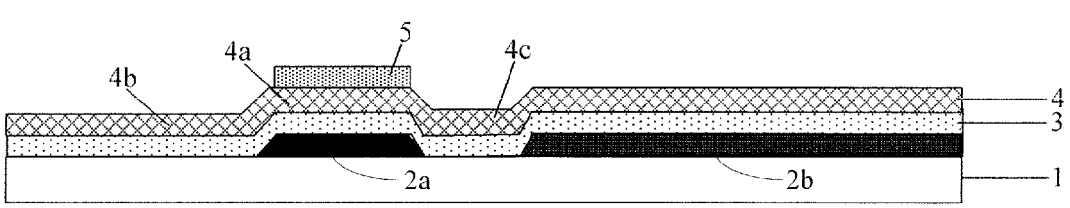
Figure 5G:
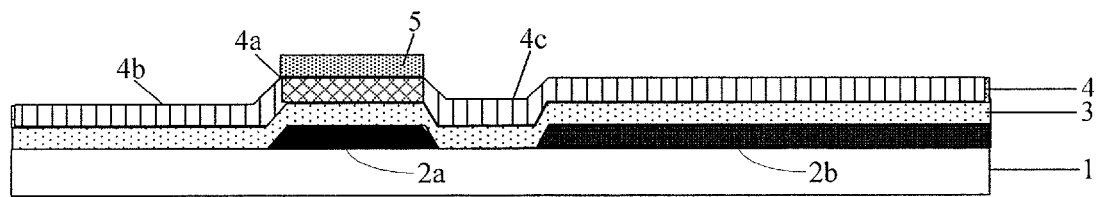

Step S20 to step S23 can refer to the step S10 to step S13 in Embodiment 2, and in corresponding FIGS. 5d and 5e, the reference numeral of the photoresist is 16. Repetitive description will be omitted in the embodiment.

Figure 4H:
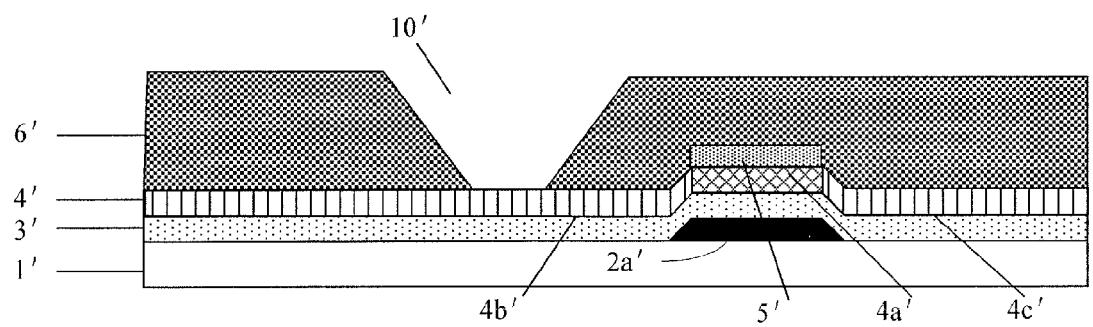
Figure 4I:
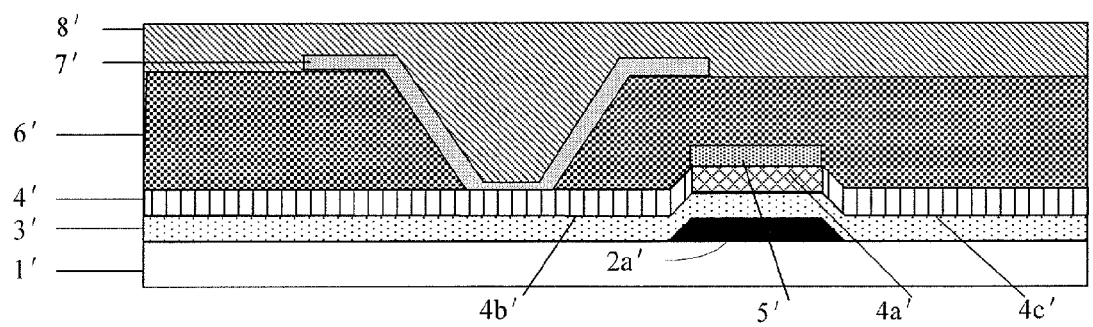

S24, as illustrated in FIG. 4h, a passivation-layer thin film is formed, and subjected to a patterning process to form a pattern including a first via hole 10'. For example, a passivation-layer thin film is coated, and subjected to a patterning process, so that a passivation layer 6' illustrated in FIG. 4h is formed and the first via hole 10' exposing a part of the drain electrode is formed in the passivation layer 6'. An organic resin, an oxide, a nitride or an oxynitride, such as silicon dioxide or silicon nitride, can be used for the passivation-layer thin film.

S25, a pixel-electrode thin film is formed, and subjected to a patterning process to form a pattern including a first pixel electrode 7'. Thereby, the first pixel electrode 7' is electrically connected to the drain electrode 4b' through the first via hole 10'. For example, a pixel-electrode thin film is deposited on the above passivation layer, and subjected to a patterning process to form a pattern including the first pixel electrode 7' illustrated in FIG. 4i. The first pixel electrode 7' is connected to the drain electrode 4b' through the first via hole 10'. ITO, IZO or other transparent, conductive resin, a graphene thin film, a carbon nanotube thin film, or the like can be used for the pixel-electrode thin film.

S26, referring to FIG. 4i again, a peripheral passivation-layer thin film is deposited on the substrate 1' with the first pixel electrode formed thereon, and then a peripheral passivation layer 8' is formed through a patterning process. An oxide, a nitride or an oxynitride can be used for the peripheral passivation-layer thin film deposited in this step.

Embodiment 5

Figure 5H:
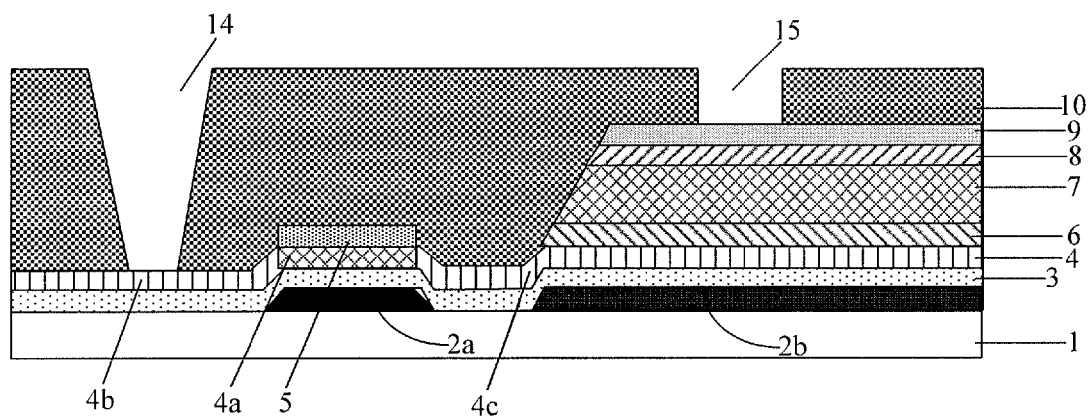
Figure 5I:
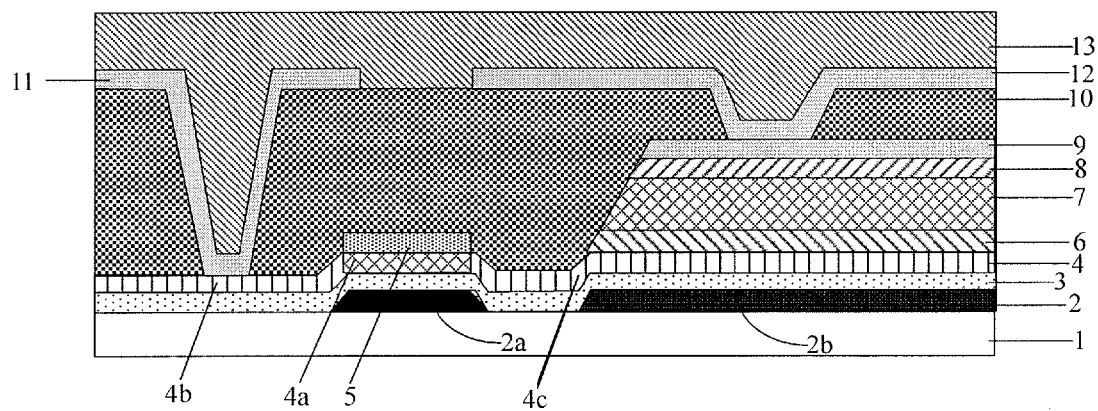

In the embodiment, an array substrate that can be used for forming, for example, an X-ray detector is provided. A bottom-gate structure is given in the embodiment as an example, namely a gate electrode is disposed below an active layer. Of course, the embodiment of the disclosure can also adopt a top-gate structure. Regarding the top-gate structure, a gate electrode is disposed on an active layer, and descriptions for detailed structure are omitted herein. As illustrated in FIG. 5i, the array substrate differs from Embodiment 3 in that, a photodiode (which includes an N-type amorphous silicon film 6, an intrinsic amorphous silicon film 7, a P-type amorphous silicon film 8 and a transparent conductive layer 9) formed on a source electrode 4c is further included. As such, under the radiation of an X-ray, X-ray photos are transformed into visible light by a scintillator layer or a phosphor layer of the detector, next, the visible light is transformed into an electric signal under the action of the photodiode, and the electric signal is read out and output by the thin film transistor. Thus, an image to be displayed is obtained. On the basis of improving the performance of the thin film transistor, the detecting accuracy and sensitivity of the X-ray detector can be enhanced as well.

Because the source electrode 4c connected to the photodiode comprises doped polycrystalline silicon, unconverted photosignal can pass through the source electrode 4. Therefore, a light blocking plate 2b disposed in a same layer as the gate electrode 2a is further included in the embodiment. The light blocking plate 2b is disposed directly below the photodiode. As such, unconverted photosignal that passes through the source electrode 4c can be blocked and reflected by the light blocking plate 2b to re-enter the photodiode, so as to make sure that photosignal can be fully converted by the photodiode.

Embodiment 6

Figure 3:
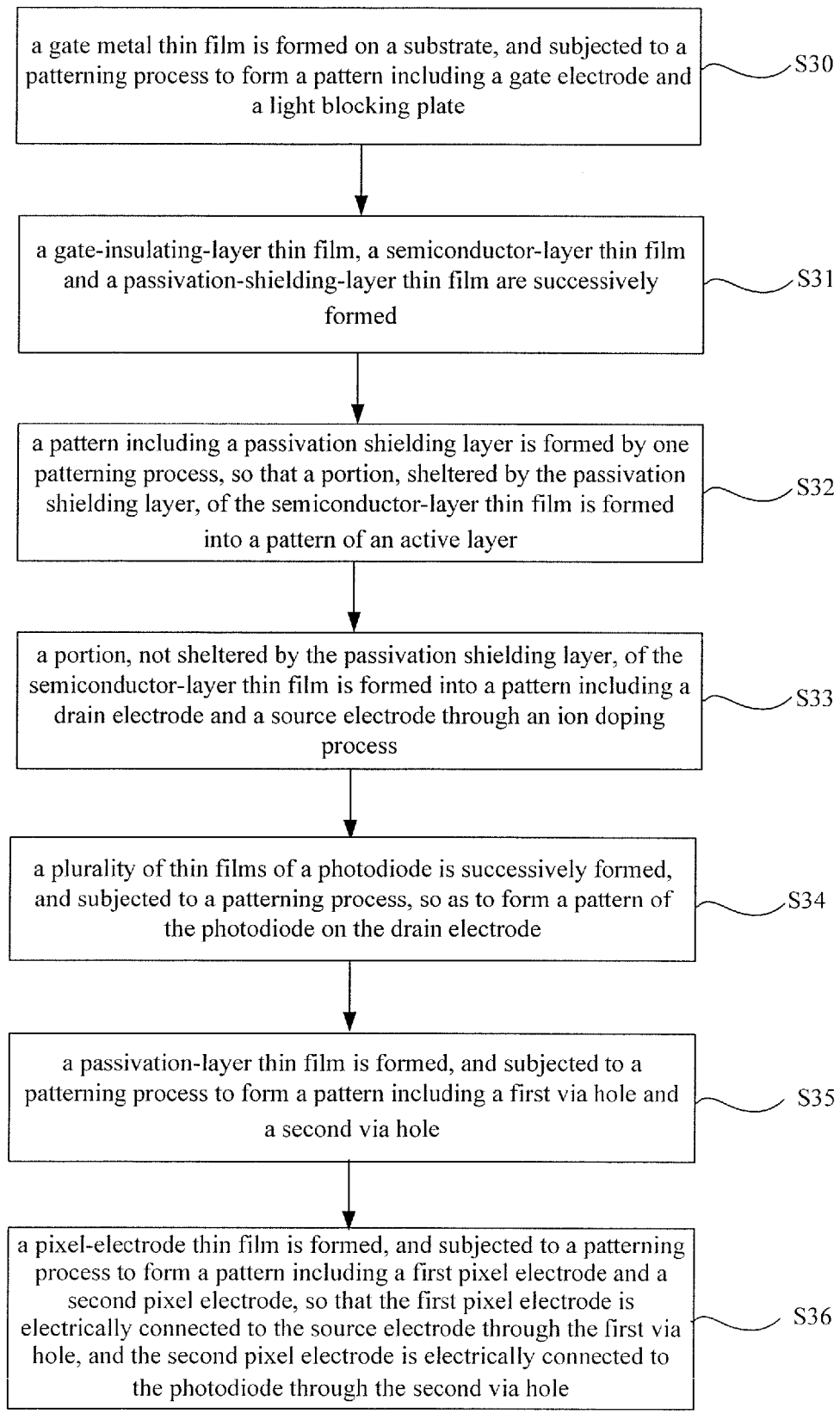
FIG. 3 is a schematic flowchart illustrating a manufacturing method of another array substrate provided by Embodiment 6 of the disclosure.

A bottom-gate structure is given in the embodiment as an example, namely a gate electrode is disposed below an active layer. Of course, the embodiment of the disclosure can also adopt a top-gate structure. Regarding the top-gate structure, a gate electrode is disposed on an active layer, and descriptions for detailed structure are omitted herein. As illustrated in FIG. 3, a method for manufacturing an array substrate (e.g., that described in Embodiment 5) is provided by the embodiment. The method includes the following steps.

S30, as illustrated in FIG. 5a, a gate metal thin film is formed on a substrate 1, and subjected to a patterning process to form a pattern including a gate electrode 2a and a light blocking plate 2b. This step differs from the step S10 of Embodiment 2 or the step S20 of Embodiment 4 in that, a pattern of the light blocking plate 2b is also formed together with the formation of the pattern of the gate electrode 2a and the gate line.

S31, a gate-insulating-layer thin film, a semiconductor-layer thin film and a passivation-shielding-layer thin film are successively formed.

S32, as illustrated in FIG. 5b and FIG. 5c, a pattern including a semiconductor layer 4 and a passivation shielding layer 5 is formed by one patterning process, so that a portion, sheltered by the passivation shielding layer 5, of the semiconductor-layer thin film is formed into a pattern of an active layer 4a.

S33, a portion, not sheltered by the passivation shielding layer 5, of the semiconductor-layer thin film is formed into a pattern including a drain electrode 4b and a source electrode 4c through an ion doping process.

In conjunction with FIG. 5d to FIG. 5g, Step S31 to step S33 can refer to the step S11 to step S13 in Embodiment 2. Repetitive description will be omitted in the embodiment.

S34, a plurality of thin films of a photodiode is successively formed, and subjected to a patterning process, so as to form a pattern of the photodiode on the source electrode 4c. For example, as illustrated in FIG. 5h, in this step, firstly, an N-type amorphous silicon film 6, an intrinsic amorphous silicon film 7, a P-type amorphous silicon film 8 and a transparent conductive layer thin film 9 are successively deposited. ITO, IZO or other transparent, conductive resin, a graphene thin film, a carbon nanotube thin film, or the like can be used for the transparent conductive thin film 9. Next, a pattern of a photodiode is formed on the source electrode 4c through a patterning process. The photodiode is disposed directly on the light blocking plate 2b, and the reason is that the drain electrode is a conductor formed of polycrystalline silicon by way of ion doping, and not a metal in an actual sense, and thus the source electrode 4c cannot block the photosignal received by the photodiode nicely. However, the light shielding plate 2b herein is formed of a metal thin film through an etching process, and thus can serve a function of blocking and reflecting the photosignal, so as to avoid the loss of photosignal. Thereby, that can also explain why the pattern of the light blocking plate 2b is also formed together with the formation of the pattern of the gate electrode 2a and the gate line.

S35, a passivation-layer thin film is formed, and subjected to a patterning process to form a pattern including a first via hole 14 and a second via hole 15. For example, a passivation-layer thin film is coated, and subjected to a patterning process, so as to form a passivation layer 10 illustrated in FIG. 5i, and to form the first via hole 14 exposing a part of the drain electrode and the second via hole 15 exposing a part of an upper end of the photodiode, in the passivation layer 10. An organic resin, an oxide, a nitride or an oxynitride, such as silicon dioxide or silicon nitride, can be used for the passivation-layer thin film.

S36, a pixel-electrode thin film is formed, and subjected to a patterning process to form a pattern including a first pixel electrode 11 and a second pixel electrode 12. Thereby, the first pixel electrode 11 is electrically connected to the drain electrode 4b through the first via hole 14, and the second pixel electrode 12 is electrically connected to the photodiode through the second via hole 15. For example, a pixel-electrode thin film is deposited on the above passivation-layer thin film, and subjected to a patterning process to form a pattern including the first pixel electrode 11 and the second pixel electrode 12, as illustrated in FIG. 5i. The first pixel electrode 11 is electrically connected to the drain electrode 4b through the first via hole 14, and the second pixel electrode 12 is electrically connected to the photodiode through the second via hole 15. ITO, IZO or other transparent, conductive resin, a graphene thin film, a carbon nanotube thin film, or the like can be used for the pixel-electrode thin film.

S37, referring to FIG. 5i again, a peripheral passivation-layer thin film is deposited on the substrate with the first pixel electrode 11 and the second pixel electrode 12 formed thereon, and a peripheral passivation layer 13 is formed through a patterning process. An oxide, a nitride or an oxynitride can be used for the peripheral passivation-layer thin film deposited in this step.

Embodiment 7

The embodiment further provides an X-ray detector, which includes a thin film transistor of any form in Embodiment 1 or an array substrate of any form in Embodiment 5. Descriptions for the thin film transistor or the array substrate can be referred to those described previously, and details are omitted herein.

Embodiment 8

The embodiment further provides a display device, which includes a thin film transistor of any form in embodiment 1, or an array substrate of any form in Embodiment 3. Descriptions for the thin film transistor or the array substrate can be referred to those described previously, and details are omitted herein.

Descriptions made above are merely embodiments of the disclosure, but the scope of the disclosure is not limited thereto. All variations or equivalents, as would be conceived easily by those skilled in the art within the technical scope disclosed by the disclosure, shall belong to the scope of the disclosure. Therefore, the scope of the disclosure shall be defined by the scope of accompanying claims.

This application claims the benefit of Chinese Patent Application No. 201310420395.6, filed on Sep. 16, 2013, which is hereby entirely incorporated by reference as a part of the present application.

What is claimed is:

1. A thin film transistor, comprising a gate electrode, a source electrode, a drain electrode and an active layer, wherein the source electrode and the drain electrode are disposed on two sides of the active layer respectively, and the source electrode, the drain electrode and the active layer are disposed in a same layer; and the thin film transistor further comprises a passivation shielding layer, and a width of the passivation shielding layer and that of the active layer are substantially identical along a direction of a connecting line between the source electrode and the drain electrode, wherein along the direction of the connecting line between the source electrode and the drain electrode, a width of the active layer and that of the gate electrode are identical, and wherein the passivation shielding layer contacts said same layer from outside of said same layer.

2. The thin film transistor claimed as claim 1, wherein the gate electrode is disposed below the active layer; or the gate electrode is disposed on the active layer.

3. A display device, comprising a thin film transistor claimed as claim 1.

4. The thin film transistor as claim 1, wherein the gate electrode is disposed below the active layer; or the gate electrode is disposed on the active layer.

5. An X-ray detector, comprising a thin film transistor claimed as claim 1.

6. An array substrate, comprising: a substrate, a thin film transistor, a passivation layer and a first pixel electrode,
wherein the thin film transistor comprises a gate electrode, a source electrode, a drain electrode and an active layer, the source electrode and the drain electrode are disposed on two sides of the active layer respectively and in a same layer as the active layer, and the first pixel electrode is electrically connected to the drain electrode; and the thin film transistor further comprises a passivation shielding layer, and a width of the passivation shielding layer and that of the active layer are substantially identical along a direction of a connecting line between the source electrode and the drain electrode, wherein along the direction of the connecting line between the source electrode and the drain electrode, a width of the active layer and that of the gate electrode are identical, and wherein the passivation shielding layer contacts said same layer from outside of said same layer.

7. The array substrate claimed as claim 6, wherein the gate electrode is disposed below the active layer; or the gate electrode is disposed on the active layer.

8. The array substrate claimed as claim 6, further comprising: a photodiode and a second pixel electrode,
wherein an end of the photodiode is electrically connected to the source electrode, and another end of the photodiode is electrically connected to the second pixel electrode.

9. The array substrate claimed as claim 6, wherein the gate electrode is disposed below the active layer; or the gate electrode is disposed on the active layer.

10. The array substrate claimed as claim 6, further comprising: a photodiode and a second pixel electrode,
wherein an end of the photodiode is electrically connected to the source electrode, and another end of the photodiode is electrically connected to the second pixel electrode.

11. The array substrate claimed as claim 7, further comprising: a photodiode and a second pixel electrode,
wherein an end of the photodiode is electrically connected to the source electrode, and another end of the photodiode is electrically connected to the second pixel electrode.

12. The array substrate claimed as claim 8, further comprising a light blocking plate, wherein the light blocking plate and the gate electrode are disposed in a same layer, and the light blocking plate is disposed directly below the photodiode.

13. The array substrate claimed as claim 9, further comprising: a photodiode and a second pixel electrode,
wherein an end of the photodiode is electrically connected to the source electrode, and another end of the photodiode is electrically connected to the second pixel electrode.

14. The array substrate claimed as claim 10, further comprising a light blocking plate, wherein the light blocking plate and the gate electrode are disposed in a same layer, and the light blocking plate is disposed directly below the photodiode.

15. The array substrate claimed as claim 11, further comprising a light blocking plate, wherein the light blocking plate and the gate electrode are disposed in a same layer, and the light blocking plate is disposed directly below the photodiode.

16. The array substrate claimed as claim 13, further comprising a light blocking plate, wherein the light blocking plate and the gate electrode are disposed in a same layer, and the light blocking plate is disposed directly below the photodiode.

* * * * *